United States Patent
Schroeder et al.

(10) Patent No.: US 8,354,582 B2
(45) Date of Patent: Jan. 15, 2013

(54) SOLAR HOME ELECTRIFICATION WITH GRID CONNECTION

(75) Inventors: Jon Murray Schroeder, Leander, TX (US); Gerald Philip Hirsch, Clarksville, TN (US)

(73) Assignee: Jon Murray Schroeder, Leander, TX (US)

( * ) Notice: Subject to any disclaimer, the term of this patent is extended or adjusted under 35 U.S.C. 154(b) by 465 days.

(21) Appl. No.: 12/454,378

(22) Filed: May 18, 2009

(65) Prior Publication Data

US 2010/0288326 A1 Nov. 18, 2010

(51) Int. Cl.
*H01L 35/30* (2006.01)
*H01L 35/00* (2006.01)
*H02J 1/00* (2006.01)
*H02M 1/12* (2006.01)
*H02M 3/18* (2006.01)

(52) U.S. Cl. .......... 136/205; 136/201; 136/206; 363/15; 363/41; 363/61; 62/3.7

(58) Field of Classification Search .................. 136/201, 136/206, 205, 293; 62/3.7; 363/15, 41, 61
See application file for complete search history.

(56) References Cited

U.S. PATENT DOCUMENTS

| | | | |
|---|---|---|---|
| 6,188,145 B1* | 2/2001 | Stewart | 307/125 |
| 6,285,178 B1* | 9/2001 | Ball et al. | 323/351 |
| 2003/0217755 A1* | 11/2003 | Koch et al. | 131/84.3 |
| 2004/0134200 A1* | 7/2004 | Schroeder et al. | 62/3.7 |
| 2004/0169972 A1* | 9/2004 | Goss | 361/84 |
| 2007/0229030 A1* | 10/2007 | Chen et al. | 320/128 |
| 2008/0130327 A1* | 6/2008 | Yan et al. | 363/21.16 |

FOREIGN PATENT DOCUMENTS

RU 2226620 C2 * 4/2004

OTHER PUBLICATIONS

J. Doucet, D. Eggleston, J. Shaw, "DC/AC Pure Sine Wave Inverter", NECAMSID, 2007.*

* cited by examiner

*Primary Examiner* — Jennifer Michener
*Assistant Examiner* — Marla D McConnell
(74) *Attorney, Agent, or Firm* — Donald E. Schreiber

(57) ABSTRACT

A means of providing solar powered electricity for day and nighttime use supported in part by power from the grid to allow a small generator to electrify the home or business with a small generator operating with much larger capacity. Excess solar energy is provided to the power company as needed.

12 Claims, 7 Drawing Sheets

SOLAR HOME ELECTRIFICATION WITH GRID CONNECTION

RELATED APPLICATIONS

This application contains improvements to pending U.S. patent application Ser. No. 10/154,757, filed May 23, 2002, entitled "Torus Semiconductor Thermoelectric Device" published Nov. 27, 2003." It also contains improvements to pending U.S. patent application Ser. No. 11/259,922, filed Oct. 28, 2005, entitled "Solid state thermoelectric power converter". It also contains improvements to pending U.S. patent application Ser. No. 11/517,882, filed Sep. 8, 2006, entitled "Thermoelectric device with make-before-break high frequency converter". It also contains improvements to pending U.S. patent application number CIP of application Ser. No. 10/340,885, filed Sep. 8, 2006, entitled "Bismuth-Tellurium and Antimony-Telluride-Based Thermoelectric Chiller".

TECHNICAL FIELD

This invention relates to the electrification of a home utilizing a solar-powered generator with utility grid connection backup. The grid connection enhances reliability and at the same time provides a means to supply the grid with excess generator power. Energy generated by a temperature differential between hot and cold fins of a thermoelectric device is more efficiently converted to electrical energy by a combination of both high efficiency semiconductor elements and a high frequency direct current switching component. When combined with an H-bridge these elements produce alternating current output of various standard voltages and frequencies. This invention provides a unified means to connect a small home generator seamlessly to electrify a home while remaining connected to the utility grid for extra power needs through a full wave bridge rectifier. In case the home generator fails, or the energy supply for the generator becomes inadequate, the utility grid powers the home through rectifiers in the failed generator. In cases where the grid fails, the generator continues to power the home without transmitting power to the failed grid. The invention prevents power surges or interruptions during switchover from grid to generator and back. The system allows generator surplus power not needed for the home to be delivered to the grid as a source of revenue. The electric system is designed to use solar heat, concentrated and transferred to a heat store during daylight hours. The heat store is used for electric production for the home during daytime and nighttime. Improved energy conversion efficiency is obtained by combining a heat storage unit directly with a thermoelectric generator device taking exhaust heat from the generator's heat cycle components, returning exhaust heat to the heat store. Conversion of solar energy to electrical energy is improved by storing solar heat in an insulated confine and then as needed using the stored heat to generate electricity by circulating heat through the hot side of the thermoelectric generator. In addition to operating thermoelectric generators with stored solar heat, a special automatic means is used to produce electricity without disconnect from the grid. The home is automatically supplied with electricity from the generator during normal loading and any power deficiency made up by the grid energy in overload conditions and during times of generator failure. In addition to automated electricity for the home, the same system is capable of feeding the excess electrical energy capacity not needed by the home into the grid both to serve as grid support for other users and as a source of revenue for the home. A special circuit prevents power feed back into the grid when the grid is down and being repaired.

BACKGROUND ART

This invention applies to electricity generation for the home and also for industry and institutions. The utility grid that powers homes and industry in the U.S. has huge capacity and spinning reserve. A home connected to the grid can use 1,000 kW-hrs or 5 MW-hrs and the grid is not affected. On the other hand, a home with constantly changing loading, powered by a generator goes through large capacity requirements over the course of the day and from season to season. One way to accommodate the large capacity swings is to use a generator that can operate to deliver 20 Watts, 44-kW, or zero Watts, instantly as loads in the household require. However this would be too expensive to consider. The operating cost of a 44-kW generator operating under constantly changing loading would also be uneconomical. The alternative is to install a much smaller, less expensive generator that is less expensive to operate, powering only loads that are required during a grid-out emergency. This invention provides a way to use a small, very efficiency generator, preferably operated with heat produced by the sun, stored for day and nighttime use. This system makes use of the grid, in a non-feedback manner, to assist in powering the upper load requirements for electrical power in the home. By remaining connected to the grid and generator, the household enjoys seven 9s reliability, the occupants oblivious to grid outages. Connected to the grid, the utility has at it's disposal nearly double the generating capacity from homes during times of grid overload by bringing online home-generated power as needed to satisfy the overloading. The utility can also utilize this feature to switch off and insure that all grid-feeding is off while distribution wiring is being repaired. The advantage to electric utilities will be instant capacity to maintain the grid and fewer, smaller, and more efficient generator plants, thereby reducing pollution.

Thermoelectric devices have been used for many years for specific applications where the simplicity of design warrants their use despite a low energy conversion efficiency. Thermoelectric generators and thermoelectric chillers have been improved in efficiency to a point where it is now practical to use them to power all the electrical and air conditioning needs for the modern home. Independent home electrical and air handling systems that normally require the combustion of carbon-based fuels, can now be operated on stored heat derived from sunlight. Solar heat, concentrated and stored for operation as needed, can be used during daytime or nighttime, year round. A unified connection means for home electric systems is needed to comply with fire safety and energy regulatory agencies, yet provide easy to install, seamless, uninterrupted electrical service for the home. The ability to make use of the grid in times of generator failure and the ability to call on the generator in times of grid brownout and failure provides the home with seven 9s reliability. Seven 9s reliability is required by most electronic systems, as opposed to the normal four 9s electric service reliability provided by grid-only service.

The voltage produced by a thermoelectric device depends on the Seebeck voltage of the dissimilar metals used. Seebeck voltages are higher for some semiconductor materials especially n-type and p-type elements made primarily of mixtures bismuth, tellurium, and antimony.

To compete with more traditional forms of heat to electricity conversion thermoelectric devices must be defect free and to be as efficient as possible. A preferred means to achieve such high efficiency is to arrange the thermoelectric element in a circle with only a very small region used to extract the energy produced by the thermoelectric elements. Patent PCT/US97/07922 to Schroeder discloses such a circular arrangement. Art teaching in this case is focused on 3 means to extract energy for the high current in the ring of elements: 1—a vibrating mechanical switch; 2—a Hall effect generator and; 3—a Colpits oscillator. Coatings of hot and cold elements of the thermoelectric device are claimed for selenium, tellurium and antimony among others but not for mixtures of these elements.

U.S. Pat. No. 6,222,242 to Konishi, et al., discloses semiconductor material of the formula $AB_2X_4$ where A is one of or a mixture of Pb, Sn, or Ge, B is one of or a mixture of Bi and Sb and X is one of or a mixture of Te and Se. These represent Pb, Sn or Ge doped bismuth telluride.

U.S. Pat. No. 6,274,802 to Fukuda, describes a sintering method of making semiconductor material whose principle components include bismuth, tellurium and selenium and antimony.

U.S. Pat. No. 6,340,787 to Simeray discloses a thermoelectric component of bismuth doped with antimony and bismuth tellurium doped selenium wherein said component is arranged into a rod. Very low voltages are converted using a self-oscillating circuit.

U.S. Pat. No. 6,172,427 describes the use of a thermoelectric device on the exhaust portion of a combustion-based car using electrically driven wheel wherein excess heat energy is converted to electric power for the vehicle.

DISCLOSURE OF THE INVENTION

Figure 1:
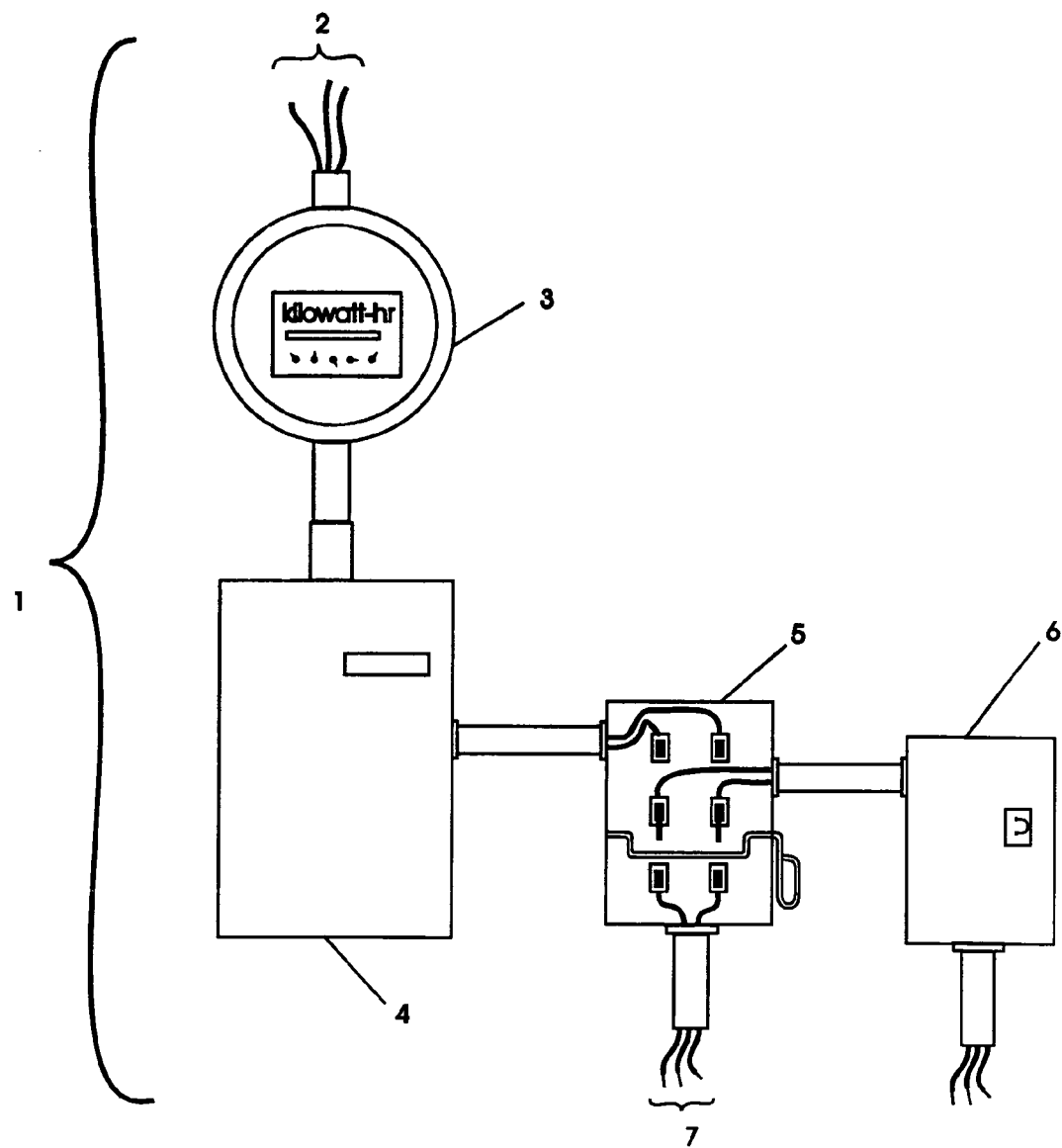
FIG. 1 illustrates a typical electrical hookup for installing a home generator to energize only select loads during grid power outage.

It is a purpose of this invention to provide improved efficiency for the conversion of heat energy to electrical energy for the home by making use of n-doped and p-doped semiconductors attached to metal heat-conducting elements in a circular arrangement of thermoelectric components.

It is another purpose of this invention to use solid state generators as a high efficiency means for transmission of energy contained in a thermoelectric ring to AC current at desired voltages by utilizing a high frequency switching circuit.

Another purpose of this invention is to improve the efficiency of said thermoelectric device by combining a solid state generator with the use of a solar concentrating heat store to operate the generator without the use of carbon-based fuels, thereby producing an around-the-clock supply of fuel-free electricity for home use.

Another purpose of this invention is to reduce the cost of thermoelectric generators by making use of same size and shape elements for all models of generators from 5-kW to 300-kW in capacity, all running with only slight variation to assembly process and test machinery.

Another purpose is to define an electrical service output switch and system preventing generator back-feed into the grid that can work with any sized generator powering household loading. By connecting the grid to flow only into this generating system, the grid can assist the home generator at times of heavy loading. Another connection system allows tens of thousands of home generator systems, when called on, to assist in holding up the grid when heavily loaded. Another purpose of this invention is to define an electrical service output switch and fuse system that can automatically drop off the grid when the grid is down for repair. Another purpose of the electrical service output switch and fuse system is to provide a means to meter and sell off surplus power.

It is also a purpose of this invention to provide reliable electricity, heating and air conditioning for the home by converting concentrated solar heat into electricity, supplying surplus power from the home system into the utility grid as an extra source of income. The surplus energy from tens of thousands of homes will help to maintain the grid in times when the only other alternative is grid brownout or rolling blackouts.

It is also a purpose of this invention to configure the system so the utility company can call upon each generator by phone to enable ten thousand and more household generators to become grid-feeders on demand. In conjunction with this feature, the same telephone system will allow the utility company to disengage all home generators to make sure generators do not feed the grid when it is down for repair. As a part of the home generator grid connection and feed system, this is done internally by sampling power on the grid every three minutes for a duration of one quarter wavelength to make sure the grid is actually operating. When the sampling system finds less than 80 volts on the grid, the generator power feed to the grid is switched off until manually reset, or on instructions from the utility company. If more than 80 volts is detected during the sampling period, the generator resumes power feed into the grid, synchronizing with utility generators. This feature operates as a large spinning reserve.

To illustrate this invention figures are drawn to show components of a few implementations of the invention. It should be understood that these figures do not in any way limit this invention as described in the claims.

The invention comprises assembly of electrical service output switches, fuse system and bridge rectifiers to automatically add grid power to home generated power when home generator is overloaded. This invention comprises a means of supplying power to normal household appliance loading. To realize the most energy efficient generator system for the home it should be sized to operate normal loading. The energy store should be sized to operate year round on historical solar radiation for the region. To size a generator and energy system for hundred-year power reliability requirements would cost defeat the advantage of having one's own independent electric system. There are occasions when power requirements for the home will exceed the capacity for any size home generator. To get around this problem, the grid is called on to assist the generator in providing power for the home. Normally, no grid power will be needed to assist the generator to power appliances in the home. The grid system is used in conjunction with the generator to help operate all of the appliances that might be used in the home at one time, such as the electric clothes dryer, the electric stove, and electric heating or air conditioning. To prevent unregulated feedback of generator power into the grid, the invention first reduces the voltage of grid power using triac-driven light dimmers. The voltage output is reduced below the normal output voltage of the generator. The lowered voltage grid power is then full-wave rectified before connecting to the direct current bus of the generator's H-bridge, which outputs alternating current from the generator. The full-wave bridge prevents generator power from ever feeding back into the grid. The reduced voltage grid power, set just below the generator's loaded output voltage automatically supports the generator seamlessly by making sure the voltage from the combination of generator and grid never falls below the preset voltage. There is no requirement for current limited, special-circuit-use in the home when the generator and reduced voltage grid feeds the home's main service electrical panel. The generator, backed up by reduced voltage grid power is the home's principal power source.

The heat source for a thermoelectric generator can be any of a myriad of combustible materials such as gasses of hydrogen, methane, ethane, propane, butane, etc, liquids such as gasoline, kerosene or crude oil, and solids such as wood, used tires, straw and other biomass materials and coal. Waste heat from other combustion activities can also be used to deposit heat in a thermal store. For example flue gasses combusted from chemical processing of organic materials can be used in a thermoelectric generator providing electrical energy for the processing plant. In a preferred embodiment, the source for the heat required for electricity production in the home is from concentrated sunlight stored in high mass, high temperature tolerant material, such as ceramic fragments. The heat store energy is maintained by high temperature thermal insulation. The temperature of the thermal store ranges between 500 degrees C. and 900 degrees C.

For several means used to generate electricity from heat, the hot gasses, heated by the heat store are passed over the generator's hot fins to heat them. In another preferred embodiment natural gas or atomized liquid fuel is combusted directly under the hot fins. In a preferred configuration the hot fins project inward with regard to a circle or ring of coupons and the hot gas is passed through or combustion occurs adjacent to the hot fins.

In another preferred embodiment the hot fins project downward, cold fins project upward with regard to a circle or ring of coupons and the hot gas is passed through or combustion occurs adjacent to the hot fins.

In another preferred embodiment the rate of fuel combustion is controlled to match the electrical demand of the thermoelectric device.

In another preferred embodiment, the rate of heat flow from a heat store is controlled to match the electrical demand of the thermoelectric generator device.

In the case of natural gas or atomized liquid fuel being combusted near the hot fins infrared radiation which passes through or is given off from the hot fins is radiated back on the hot fins by a reflective metal.

In another preferred embodiment the reflective metal is backed by an insulating layer.

In one form of the invention an opening is made in the top reflecting dome to allow hot gas to escape from the top.

A preferred embodiment of the invention is to use hot air re-circulated from a heat store that is heated by collected sunlight. The sun as a heat source is free to the user, the heat from the store and the electrical supply produced from heat from the store is available daytime and nighttime by sizing the heat store large enough to operate for weeks during overcast days. During times of overcast, supplemental heating using carbon-based fuels can be used to maintain the heat store until the sun reappears.

A preferred embodiment of the invention uses electrical energy from the grid connection to supplement electricity produced from stored heat derived from concentrated sunlight.

A unique method is used to extract energy from high current flowing in the ring of the thermoelectric generator device. An insulator and up-converter component is inserted into a filled ring of thermoelectric coupons. The insulator forces current into an up-converter means for extracting electrical energy. This insulator and up-converter is place between any two coupons of a ring. On each side of the insulator is a conductor of the up-converter, which extends outward from the ring of coupons. The conductor is divided in half with one half being wound around the center core of a high frequency transformer in one direction and the other half being wound in the opposite direction. To control current flow in one or the other direction MOSfet switches are inserted as part of the up-converter circuit of the primary winding taken from the ring of coupons. The number of switches employed in parallel is determined by the maximum amount of current generated in the ring and depends on the number and capacity of the MOSfet switches connected in parallel.

In a preferred embodiment a pulse-width modulator chip is used to control the MOSfet switches. If a simple oscillating circuit is used optimum power is not obtained. If a pulse-width modulator is used in a make-before-break fashion very high spikes of current are avoided. Otherwise such spikes would adversely affect electric devices that use the secondary voltage outputs as well as all other electronic devices in the neighborhood.

Secondary windings in the outer portion of the up-converter produce desired output AC voltages. The number of windings needed depends on the current in the ring and the efficiency of extracting that energy. The number of windings in the secondary needed is determined by those skilled in the electronic arts.

Conversion of heat to electricity is improved in a closed loop thermoelectric device by utilizing a combination of n-type and p-type semiconductor wafers. These wafers produce a high Seebeck effect thereby producing a higher voltage output for a given thermal differential. The current produced by the thermoelectric voltage in the closed loop is steered through a high frequency switching up-converter. The up-converter transforms energy to a voltage equal to that supplied by the grid. At this point the voltage is at a very high frequency. By rectifying current produced by the generator ring, and transformed by up-converter to useful voltage, and by processing through an H-bridge, electrical energy is produced to that of grid voltage and a useful frequency such as 50 or 60 Hz.

Electrical energy from the grid can be lowered in voltage slightly below the output voltage of the generator. This is accomplished using triac dimmers and then rectified to direct current using a full wave bridge. The output terminals of the bridge are connected positive-to-positive and negative-to-negative between grid full-wave bridge and the direct current bridge of the generator, in between generator full wave bridge and H-bridge. With this circuit, no electrical energy from the generator can back-feed into the grid, as prevented by the full-wave bridge after dimmers. Should the generator be loaded to the point where the voltage from the generator's bridge goes below the voltage fed by the grid, the grid's conditioned power will then feed into the generator's H-bridge, adding to the energy produced by generator alone.

The thermoelectric generator produces power in the form of 220 volt, 50 Hz. or 60 Hz. split phase to two 120V circuits, the frequency selected by switch. This same format is standard for all U.S. households on 60 Hz, and in European and Latin American homes that use 50 Hz. as a 220-volt power standard.

In this invention, the generator power source and the utility grid are connected to the home's main service panel through a double-pole, double-throw transfer switch. In this way, the home's service panel can be connected either to the grid or the generator, but not to both at the same time. This is a requirement of the National Electrical Code, NEC Article 702-6, and all electrical suppliers, for two very good reasons. It prevents the back flow of current into the utility's lines during a grid outage. It also prevents damage to the generator when regular service is restored.

For typical single-phase, 120/240 volt power service, the transfer switch must be the double-pole, double-throw type, that is manually operated. Double pole means that there are two parallel paths and separate connector lug sets available for connection of hot conductors. The neutral wire is continuous through the transfer enclosure and is grounded to the case as in NEC Article 230-83. The ground wire passes through and connects to the switch enclosure to provide a safe and continuous ground connection for all switch panels. One position of the transfer switch for a typical home generator installation supplies grid power to the main service electrical panel of the main panel and sub-panels of the home. The other position of the transfer switch connects only special circuits in the home to the generator. A small home generator can power only a few loads required during grid outage such as a water pump, refrigeration, basic lighting. Typically the transfer switch is located between the utility meter and the two types of loads to be served, the main panel during normal grid operation and only a few special appliances can be powered by the generator during grid-out emergencies.

This invention allows the home's main power panel to be powered by the generator at all times. Grid power feeds into the system through special circuits to make up the difference between power the generator can supply and the power the home uses in normal operation. A transfer switch is used to place the home's main panel connected to either the generator or connected to normal grid service. This reduces the amount of grid electricity needed for a home generator that uses stored solar heat to produce electricity. The main panel selector switch is the single-pole-double-throw, SPDT, style so there is no chance for grid voltage to connect with generator voltage at the same time. The minor inconvenience in using this type switch is appliances will loose power for a short duration when switching from the grid system to generator and back. The benefit of separating grid and generator allows the home to be powered by generator at all times using the grid to supply the difference in what the home needs and the energy the generator can supply.

Another object of the invention is to provide the home with the lowest cost, highest reliability power by making use of both generator and grid power in a seamless way that benefits both grid users, the power industry and the homeowner. The power companies will have a new means of connecting thousands of home systems into the grid by automatic telephone call-up system. This feature can be used to place the extra power of tens of thousands of home generators to support the grid in an overload condition. The same means can be used as a fail-safe means to disconnect all generator feeds into the grid while workers are restoring grid power during emergencies.

The device disclosed herein, consists of two gate turn off thyristors, heavy duty light dimmers, Each thyristors power a full wave rectifier bridges that feeds the home generator when overloaded. The direct current outputs of the thyristor-powered bridges are connected directly to power the A and B sides of the DC bus inside the generator. The DC bus of the generator is located in between the generator's bridge rectifiers. The bridge rectifiers are driven by the generator's up-converter, and the generator's H-bridge that produce a split-phase output. Adjustment of the two heavy-duty dimmers allows the user to determine how much electrical energy will be purchased from the utility company to satisfy peak loads in the home.

Under conditions of normal loading for the home generator a ten percent decrease is set in the voltage of the grid voltage. This accomplished by dropping this voltage that is across split phase DC legs of the generator's A and B legs. The dimmer thyristors can be increased so the A and B legs are slightly higher causing the amount of energy from the grid to be increased. Increasing dimmer support for the generator's DC bus allows the DC feed into the generator to supply the extra power the generator cannot manage. The homeowner can determine by analyzing the next month's grid bill to decide if they want to pay more or less for their grid service or allow larger voltage swings in the home. Setting the grid voltage support ten percent below normal generator voltage will allow the generator to carry roughly 97% of the loading, the homeowner paying only for three percent of the power needs. This minor cost, prepaid on an annual basis avoids a "Stranded Facility Charge" by the utility or a complete interruption of service. Should large loads come on line in the home such as the electric stove, air conditioning, or the clothes dryer coming online at once, the grid will supply the difference between the energy the generator can produce and that needed by extra large loading. By using direct current produced by the combination of thyristor controlled dimmers and full wave bridge, no unauthorized generator current can be delivered back into the grid. The thyristor adjustment is used by the homeowner to adjust the monthly utility bill, maintaining it slightly above the minimum required to remain connected to the grid.

It is important for the customer to remain connected to the grid and in the good graces of the utility because a grid connection allows the home to realize seven 9s reliability, a feature that would otherwise require the use of three or more generators in service at all times. The other issue, equally important, is the ability of tens of thousands of small home generator systems to hold up the grid during times of overload. In some progressive states like California and New York, utility companies allow small customers to sell surplus electrical energy back to the grid for revenue. Other States like Texas, the customer is allowed to input energy into their grid, receiving no compensation other than a small discount for the amount of grid power the customer actually uses beyond the minimum they must use. Utility contracts almost always require a minimum amount of energy usage, i.e. dollar a day, or a service disconnect can occur.

For clarity of the disclosure and definition of the claims the following terms are defined:

"Generator" means: a device for producing electricity.

"Thermoelectric" means: A solid state device that operates by the flow of holes and electrons driven by either thermal flow or the flow of current.

"H-bridge" means: A device for converting direct current into alternating current.

"Up-converter" means: A device for converting high current, low voltage into high voltage moderate current more useful for home electric service.

"Thermoelectric device" means: A solid state generator or chiller.

"Seven 9s reliability" means: An electric service that will be available 99.99999 percent of the time or less than a quarter wave length of 60 cycle per second alternating current electric service.

"Household loading" means: The electrical loading of household appliances, lighting, air conditioning, heating, and the power needed for a well pump and sanitary sewer in some cases.

"Semiconductor" means: a mixture of one or more elements that has the property of allowing either electrons or holes to move through the mixture depending on whether the mixture has an excess n-type or p-type dopant. The semiconductor nature of thermoelectric wafers is well established in the thermoelectric literature.

"Facility" means: a home, a business, an apartment, an apartment complex, a factory, or other electricity utilizing customer being provided electricity from the grid.

"High mass" means: A high temperature material such as ceramic fragments that can store very high heat content for long periods in high temperature insulation confine.

"Grid-Feeder" means: a generator that inputs electric energy into the grid.

"Split-phase format" means: The standard electric power format for U.S. homes where one 240 Vac leg of a 3-phased utility transformer is split by including an earth ground between a 240 Vac leg to deliver the home two 120 vac power legs. The 120 Vac legs are used for lighting and small appliances with an earth-ground, and the 240 Vac is used for heavy loads such as air conditioning, heating, electric clothes dryer and stove.

"Multiple-pole-double-throw means: A special switch that operates two or more parallel and independent switches, each disconnecting between one pole set before connecting to another set and back again.

"A and B legs" means: The 120 volt legs separated by a common ground.

"Gate turn off thyristor" means: a semiconductor switch that can switch alternating current effectively.

"Full wave bridge rectifier" means: A rectifying bridge circuit used to convert alternating current into direct current, current that flows in one direction only and not back into the grid.

"DC bus" means: The DC power bus inside generator in between the generator's bridge rectifiers and the generator's H-bridge.

"Direct current" means: electrical current that flows in one direction only as compared to alternating current that flows periodically in two directions.

"Alternating current" means: electrical current that flows in two directions periodically as compared to direct current that flows in one direction only.

"Fin" means: an elongated metal slab with optional tapered ends which are connected on one side to an n-type semiconductor and on the other side to a p-type semiconductor or optionally connected on either side to a conductive wedge.

"Cold fin" means: a fin to be cooled or a fin to be allowed to cool.

"Hot fin" means: a fin that is to be heated.

"Coupon" means: a repeating component of the thermoelectric device made up of at least one n-type semiconductor, one hot fin, one p-type semiconductor, and one cold fin. In the device having a conductive wedge component with each set of fins and semiconductors a coupon includes the wedge component.

"Wafer" means: an n-type or p-type semiconductor made in the shape of thin slab where the thickness of the shortest dimension is from 1% to 20% of the either of the other dimensions.

Before describing the methodology for connecting thermoelectric generators to the home and the power grid using the invention, figures are provided that illustrate such a working version. Examples are intended to illustrate the basic principles and elements of the device and is in no way intended to limit the scope of the invention as described in the claims.

DISCLOSURE OF THE INVENTION

To illustrate details of this invention figures are drawn to show components of a few implementations of the invention.

FIG. 1 illustrates a typical electrical hookup system 1 for installing a generator in the home. FIG. 1 shows the normal hookup required for connecting a generator used to power special circuits in the home during times of grid outage. Grid power 2 comes into the home through overhead or buried wires to the service meter 3. Wires from meter 3 connect to main electrical service panel 4. The maximum power requirement for a modern home ranges between 100 and 200 amperes. To connect a small generator in the home, a special double-pole, double-throw switch 5, is required by code to manually and positively separate any circuit the generator might energize from circuits that are grid energized. During a grid power outage, special circuits connect a standby generator to provide electricity to a refrigerator, a small electric heater, and perhaps the water pump. A small 5-kW generator through special circuit sub panel 6 can also power selected lights. Sub panel 6 connects to the center posts of the DPDT switch 5 to allow the special circuits to be operated either by generator or from grid power 2 through the home main service panel 4. The generator connections 7 are shown connecting to DPDT switch 5. This circuit completely eliminates the danger of crossing out-of-phase generator power produced by the generator with that of the grid 2.

Figure 2:
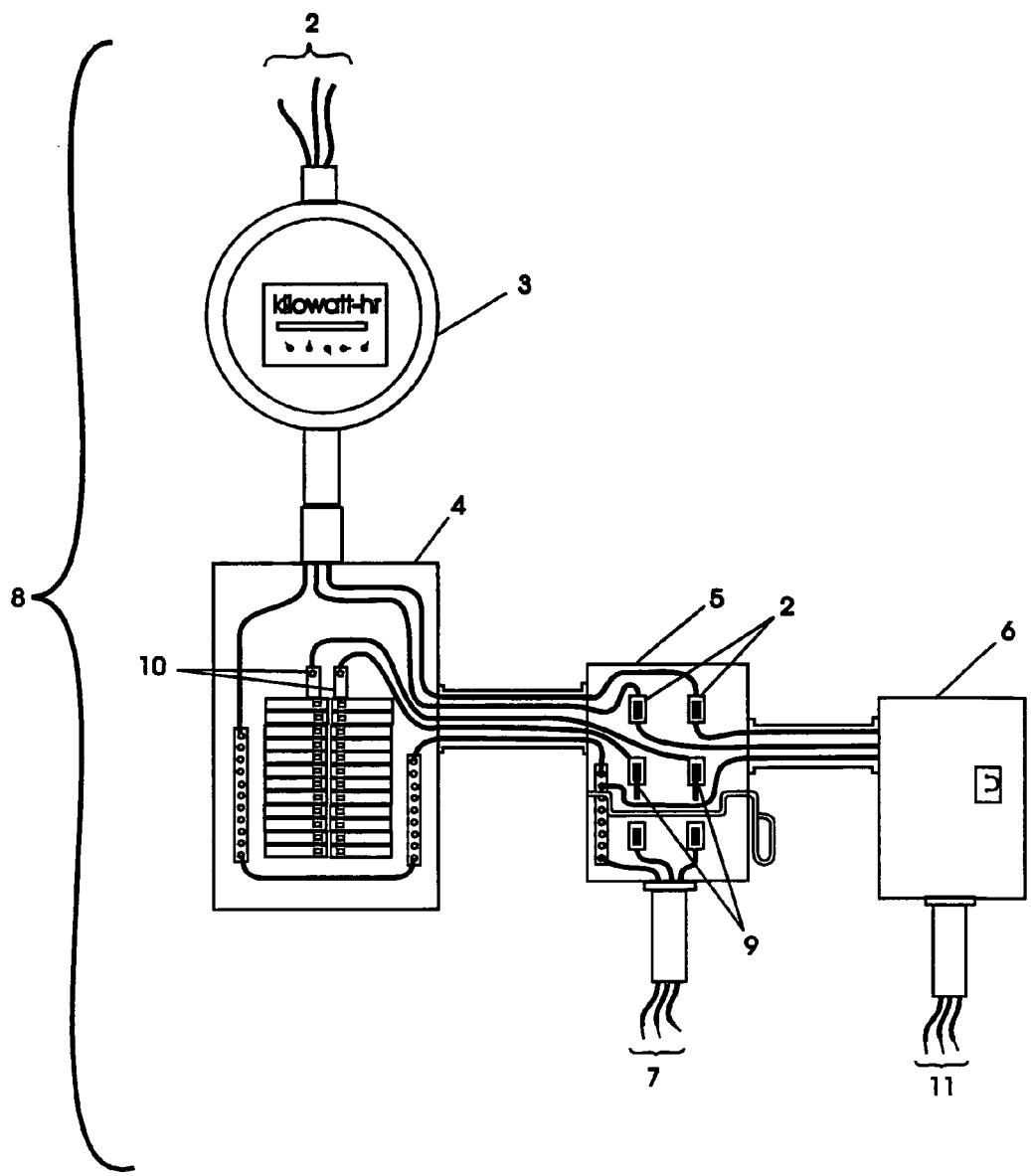
FIG. 2 illustrates a new circuit that allows the entire home electrical panel to be energized at all times, assisted by power from the grid.

FIG. 2 illustrates system 8 a novel way to connect a generator to the service panel of the entire home. The parallel switch throw blades 9 of DPDT switch 5 connect directly to main panel 4. The grid power 2 enters power meter 3 and passes through the service panel 4 making connections to the upper terminals of DPDT switch 5 at 2. Generator power 7 connects to terminals of DPDT switch 5 at lower terminals of DPDT switch 5 with the grid connected to upper terminals of DPDT at 2. The significance of this circuit is; grid connections 2 and generator connections 7 remain separated with this switch arrangement at all times, required by electrical code. In FIG. 2, grid connections 2 pass from connections in DPDT transfer switch box 5 into a special circuits box 6 so that grid power can be processes in a one-way circuit to add power as needed to help the generator during times of overload. Output leads 11, from special circuit box 6 are connected after processing to a special power bus in the generator. Power from the generator is then applied to the main service panel 4 of the home, the electrical panel energized at all times by either the generator or the grid 2, assisted by reduced voltage one-way grid power, to assist the generator through sub-panel 6. The combination of generator and special processed grid power provides power for the main panel 4 as needed. Should the generator ever fail, a simple flip of DPDT switch 5 returns grid power directly to the main-panel 4.

Figure 3:
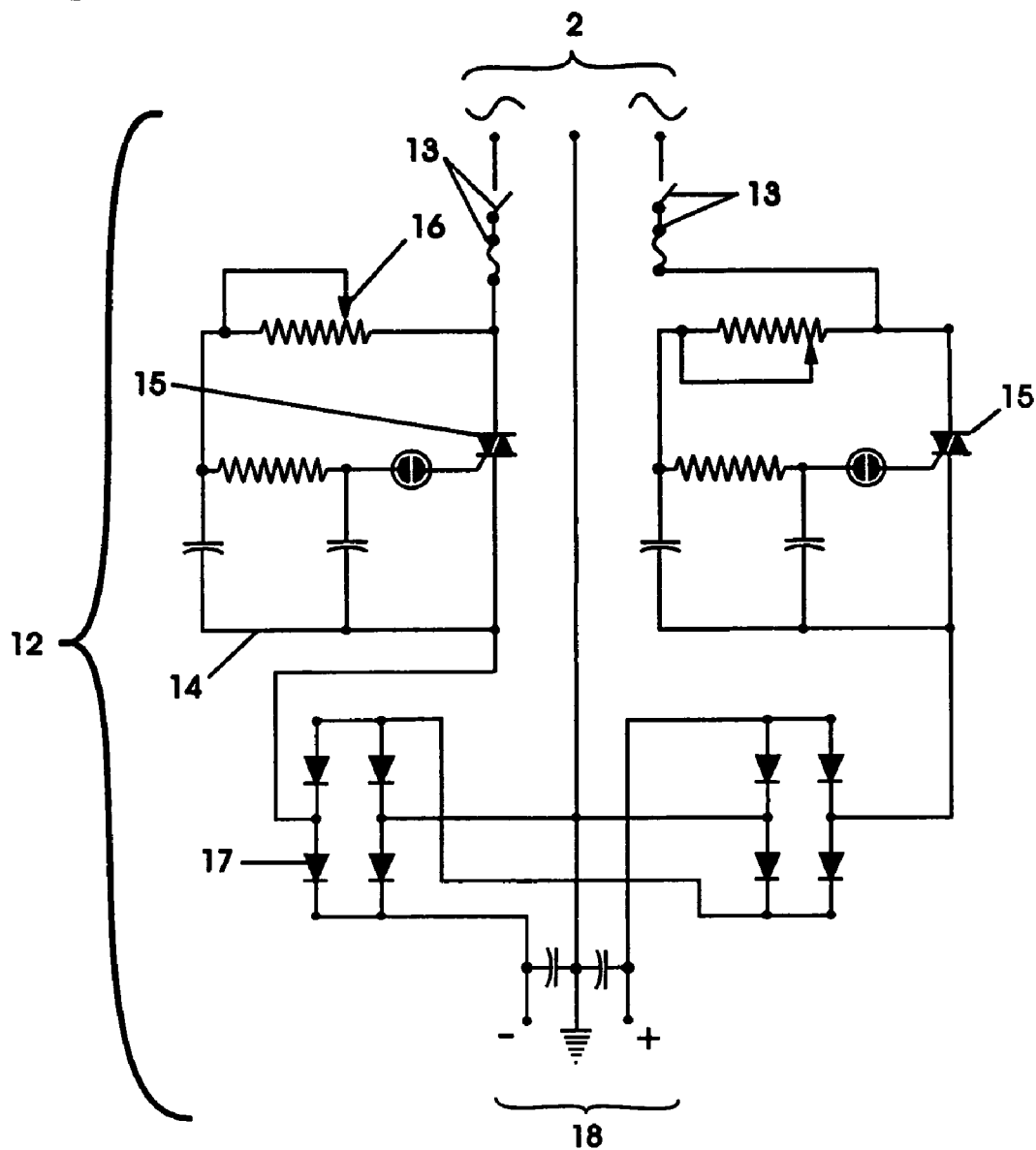
FIG. 3 illustrates a circuit for reducing grid voltage below the home generator's voltage, then rectifying this current to prevent home voltage dropping below reduced grid voltage.

FIG. 3 illustrates circuit 12 for reducing and rectifying the grid voltage, adjusted below the home generator's voltage. Two current limiting circuit breaker switches 13, are grid powered 2 in circuit 14 located in circuit box 6 of FIG. 2. Grid voltage is reduced by two triacs 15, the RMS voltage adjusted below regulated generator voltage by variable resistor 16 of circuit 14. Full wave rectifier bridge 17 converts reduced grid voltage into direct current and outputs processed DC voltage at 18. Wires at 18 connect to the DC bus of the generator. FIG. 3 shows mirrored circuits that process the A and B legs of the reduced and rectified split phase grid. Current processed through this circuit can flow only one-way into the generator and not back into the grid because of the diodes in the full wave bridges 17.

By adjusting resistors 16 in the triac operated dimmer circuit 14 to below the normal operating voltage of the generator's DC bus, no grid current can flow through circuit 12 until the generator DC bus voltage is loaded down, below reduced grid voltage settings. When this event happens, enough grid current flows through circuit 12, inputting current into the generator's DC bus to prevent home voltage from dropping below the reduced grid voltage settings regardless of household loads. Power is borrowed from the grid on either A or B legs in this way to allow the generator to operate as if it were a 44-kW generator running the home's 200 Ampere main panel when necessary.

Figure 4:
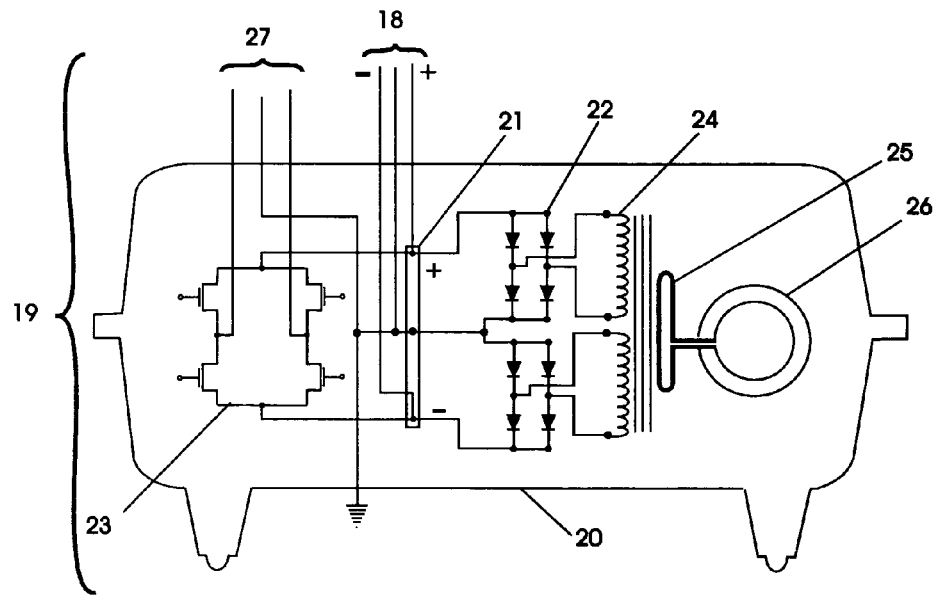
FIG. 4 illustrates the generator's internal circuitry, the internal DC bus.

FIG. 4 illustrates the generator's internal circuitry 19 with reduced voltage grid DC input 18 entering generator case outline 20. The internal generator DC bus 21 is located in between generator bridge rectifiers 22 and generator's H-bridge 23. The + DC voltage of the reduced voltage grid 18 connects to the + side of the generator's DC bridge 21, the negative leg of 18 connecting to the negative side of the generator's DC bus 21. Generator full-wave bridge 22 is driven by generator's up-converter secondary 24 and primary 25, all powered by heat driven thermoelectric ring 26. The generator's H-bridge 23 outputs a combination of electrical energy produced by the generator in case 20 and the reduced voltage and rectified grid at 220 Vac, 50 or 60 Hz. through outlet wires 27. The H-bridge 23 supplies the electrical power for the entire home through main electrical service panel 4.

Figure 5:
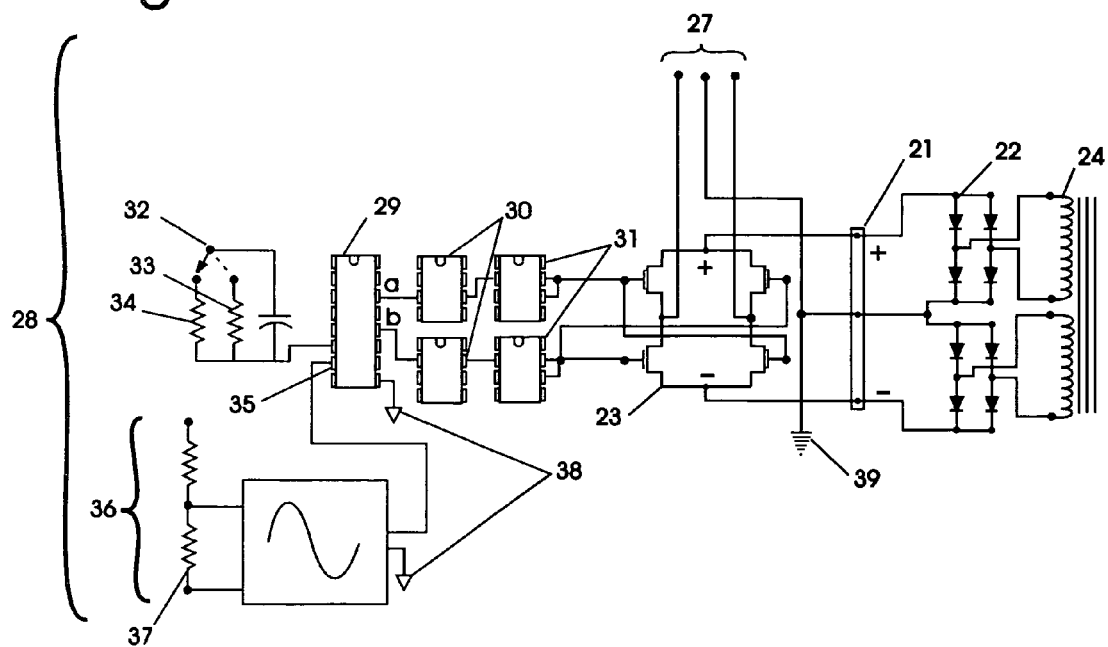
FIG. 5 illustrates an extension to FIG. 4 circuit that includes a way to match AC frequency with the grid for power insertion into the grid.

FIG. 5 illustrates a special electronic circuit 28 that drives H-bridge 23 with a pulse width modulator chip 29 through voltage supply isolators 30 and MOSfet drivers 31. The pulse width modulator chip 29 is tuned to 50 or 60 Hz. frequency by selector switch 32 selecting either frequency by connecting either resistors 33 or 34 when the generator is operated off-grid. Synchronization pin 35 on pulse width modulator chip 29 is driven with a sine wave generated by wave-scaler 36 connected to resistor ladder 37. Resistor ladder 37 is connected across power grid 2 so that wave-scaler can reference and exactly match, replicate, and synchronize generator power output with that of grid power exactly. Power factor correction for the grid can also be a feature embodiment of this invention. Circuit 28 is a standard option within the generator to facilitate grid connection or to operate off-grid using selector switch 32 to select operating frequency. Selection of 50 Hertz or 60 Hertz frequency can also be accomplished by jumper connections. Electronic low voltage ground to operate circuit is shown as 38. The AC high voltage grid earth ground is shown as 39. In FIG. 5 circuit 28 matches AC frequency of the generator exactly to the grid for power insertion into the grid as called for by electric code and the utility company's specifications.

Figure 6:
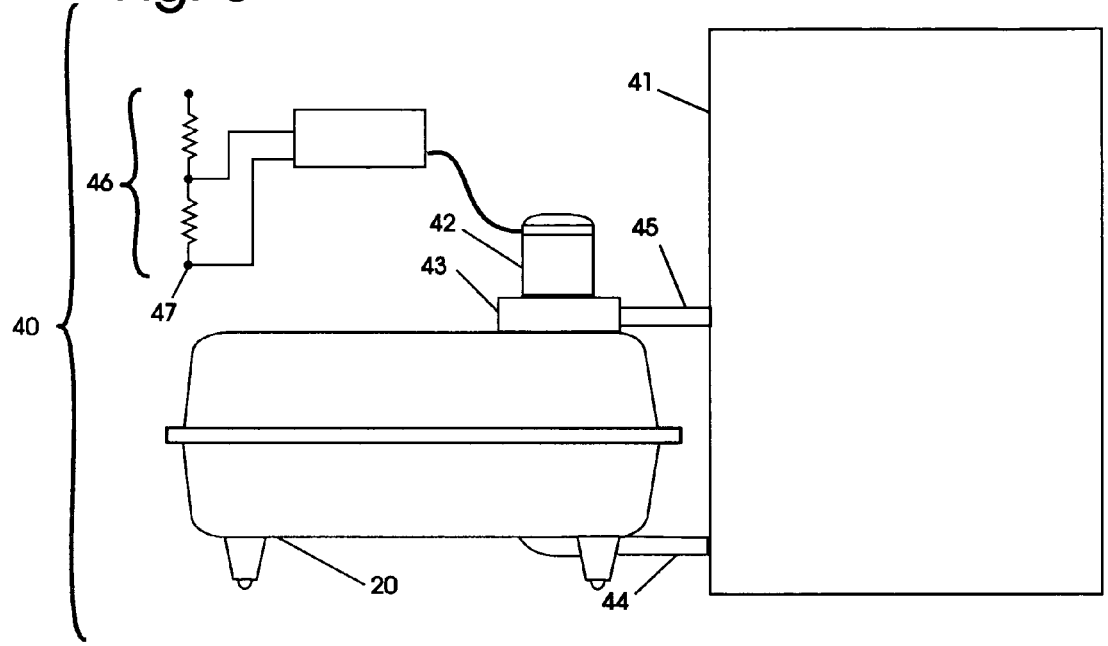
FIG. 6 illustrates a control system for increasing the power output for a generator by increasing heat flow through the generator.

FIG. 6 illustrates a control system 40 for increasing the electrical power output of generator 20 by increasing heat flow from a heat store 41 that passes through the generator 20 as heated air by speeding up hot air circulation motor 42 driving heat blower 43. Heated air from insulated heat store 41 is pulled into generator 20 through insulated tube 44 by motor 42 driving hot air blower 43. Exhaust heated air from generator 20 is returned to heat store 41 through insulated hot air tube 45. The output voltage of generator 20 under loaded conditions can be matched exactly between generator 20 and grid 2 by increasing heat flow through generator 20. To cause current to flow from generator 20 into grid 12, the voltage output of generator 20 must be increased above grid voltage to make this happen, additional hot air is caused to pass over the hot fins of ring 26 of generator 20 in FIG. 4 by increasing blower motor 42 speed. This increases the temperature differential between hot and cold fins, which increases generator output voltage. The over all effect is an increase in power output for generator 20 at the expense of using more heat from insulated store 41 to make electricity. Blower speed controller 46 uses grid reference voltage 2 and the output voltage of generator 20 through resistor ladder 47 to control blower motor 42 speed. When activated, motor speed controller 46 sets motor 42 speed to control generator 20 output voltage higher than grid voltage to facilitate power insertion into the grid from generator 20.

Figure 7:
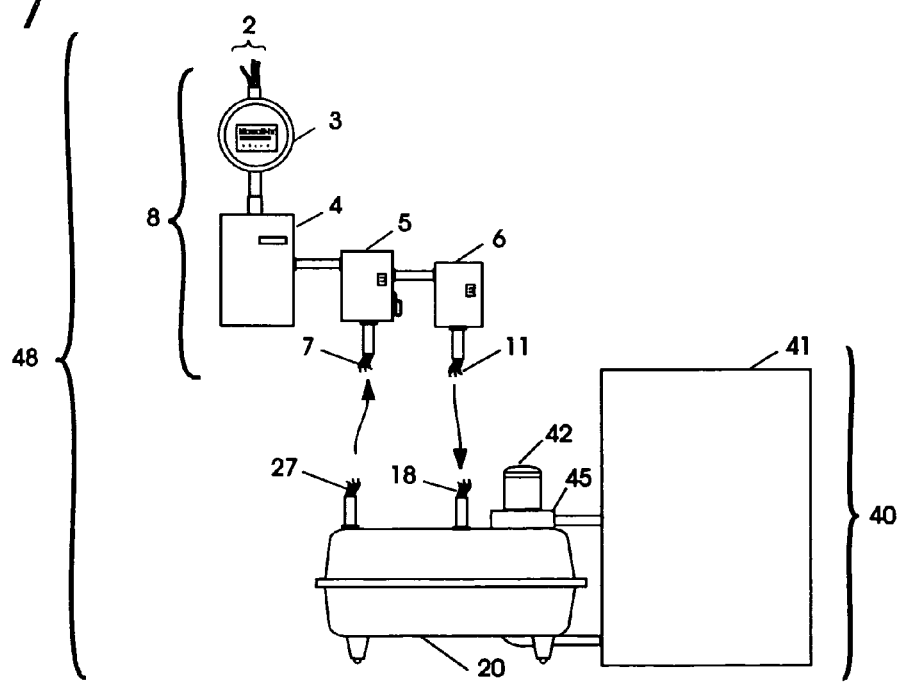
FIG. 7 illustrates a generator driven by a heat store with connections to provide electricity to the household power panel.

FIG. 7, system 48 shows a generator 20 driven by heat store 41 in system 40. This combination can receive power from grid 2 as reduced voltage direct current from the grid processed in panel 6 while powering the home's main power panel 4. System 48 can also insert the extra power of generator 20 caused by a heat flow boost from increased motor 42 speed that is not needed in the home back into the grid through DPDT switch 5 by electrical connections to the combination of switch panels 8. Generator 20 provides electricity for the household power panel 4 through wires 27 and 7 and grid power is supplied to generator 20 as needed through one-way connection of wires 11 and 18. All connections to provide grid power 2 to the generator 20 and generator 20 connections to power-the home main panel and also to insert power into the grid are as called for by electric code and the utility company policies. Connections are available at 7 and 27, then at 11 and 18 of FIG. 7. A special controller is used to make these connections as shown in FIG. 8.

Figure 8:
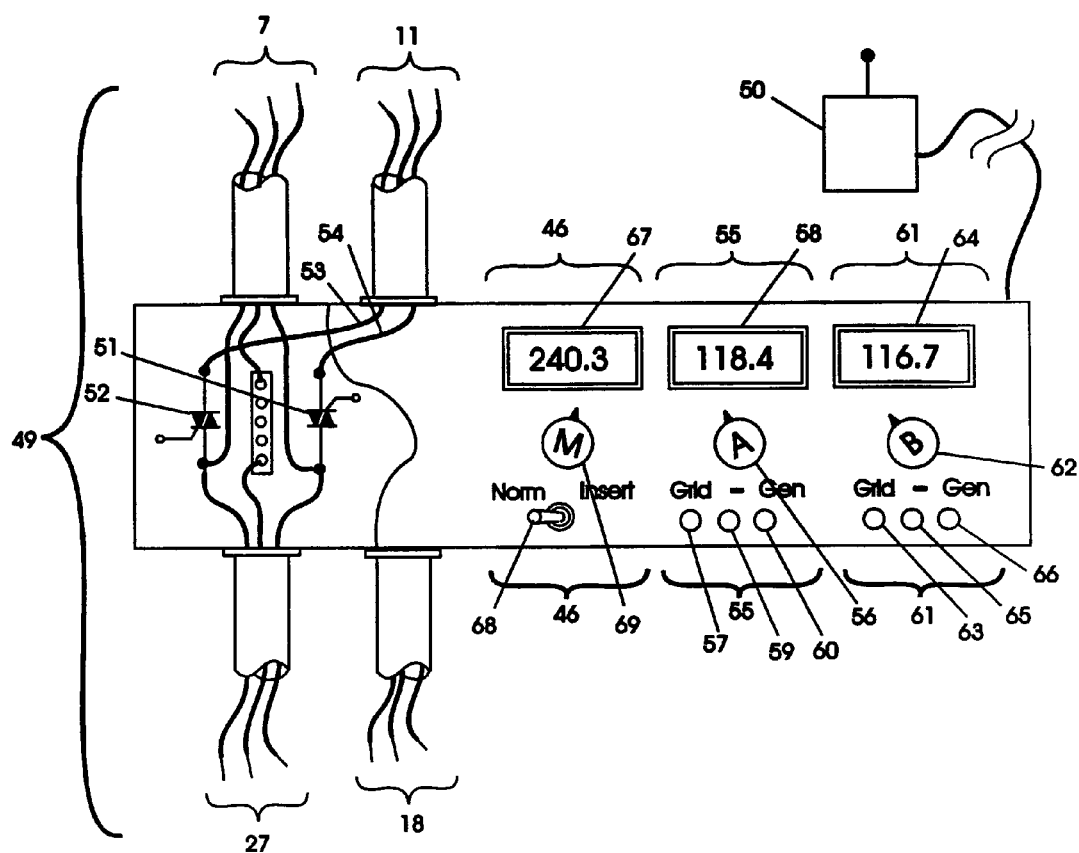
FIG. 8 illustrates a control system that allows the utility to call by telephone link for increased power from the generator and power insertion into the grid.

FIG. 8 illustrates a manual control system 49 that allows the utility company to call into system 49 through telephone link 50 to latch switches that instantly increase generator power by causing the increase of heat flow through generator 20 by increasing the speed of motor 42 with controller 46. The telephone link is also used to latch on-switched triacs 51 and 52 connecting the increased output of generator 20 to the grid through wires 53 and 54 passing through disconnecting circuit breakers 13 in panel 6 of FIG. 2. System 49 contains an A-leg of the split-phase power sub-system controller 55, adjusted by knob 56 that is the variable resistor 15 in circuit 12 of FIG. 3. Knob 56 can be used to set the reduced, rectified grid voltage of A-leg to help generator 20 when A-leg is overloaded. By pressing button in 57, voltage meter 58 indicates grid voltage available on leg A. When button 59 is pressed, meter 58 indicates reduced, rectified grid voltage available to generator 20 A-leg. With button 59 pressed, this voltage can be adjusted up or down by turning knob 56. Sub-system 61 of 49 contains a B-leg control of the split-phase power. Control knob 62, which is the variable resistor 15 in 12 of FIG. 3 is used to set reduced, rectified grid voltage for the B-leg feed 18 to generator 20. By pressing button 65 in controller 61, voltage meter 64 indicates reduced, rectified grid voltage available to generator 20 for leg B. When button 65 is pressed, meter 64 indicates reduced grid voltage available for leg B as adjusted up or down by turning knob 62 while button 65 is pressed. Pressing button 66 allows voltage meter to measure the B-leg of generator output.

In FIG. 8, sub-system 46, placing toggle switch 68 in the "norm" position allows the measurement of utility company grid voltage with meter 67. By moving toggle switch 68 to "Insert" position, generator 20 output voltage can be adjusted higher for grid power insertion by adjusting knob 69 that manually operates blower motor 42 to a higher speed than generator 20 normally uses under normal loading, producing an output voltage higher than that of the grid. When the utility company chooses to connect extra power capacity of thousands of homes, telephone link 50 is used to connect as many home generators as needed on-grid by latching motor speed controller subsystem 46 into high mode and latching triacs 51 and 52 into "on-switched mode" for grid insertion.

To remove this home generator and all others in the region from the grid during distribution maintenance, the utility company uses telephone links 50 to call and disconnect generators, latching triac switches 51, 52 in the off-mode. High blower motor speed at controller 46 will be returned to the normal speed setting used for home power. The homeowner may move knob 69 of subsystem 46 up and down to find a month-to-month balance for the utility billing. Moving motor speed higher may waste more heat from the heat store than necessary while contributing little to reduce the minimum utility bill each month. On the other hand, adjusting knobs 56 and 62 in subsystems 55 and 61 can reduce the amount of the monthly utility bill to just above the required minimum to remain connected to the grid. Should the utility company choose to pay the homeowner for the amount of power inserted into the grid, the adjustment philosophy becomes important and requires optimization of settings. Depending on whether the homeowner is saving on the minimum usage required or whether the utility will allow the home generator system to earn by co-generation settings full on will be different.

Figure 9:
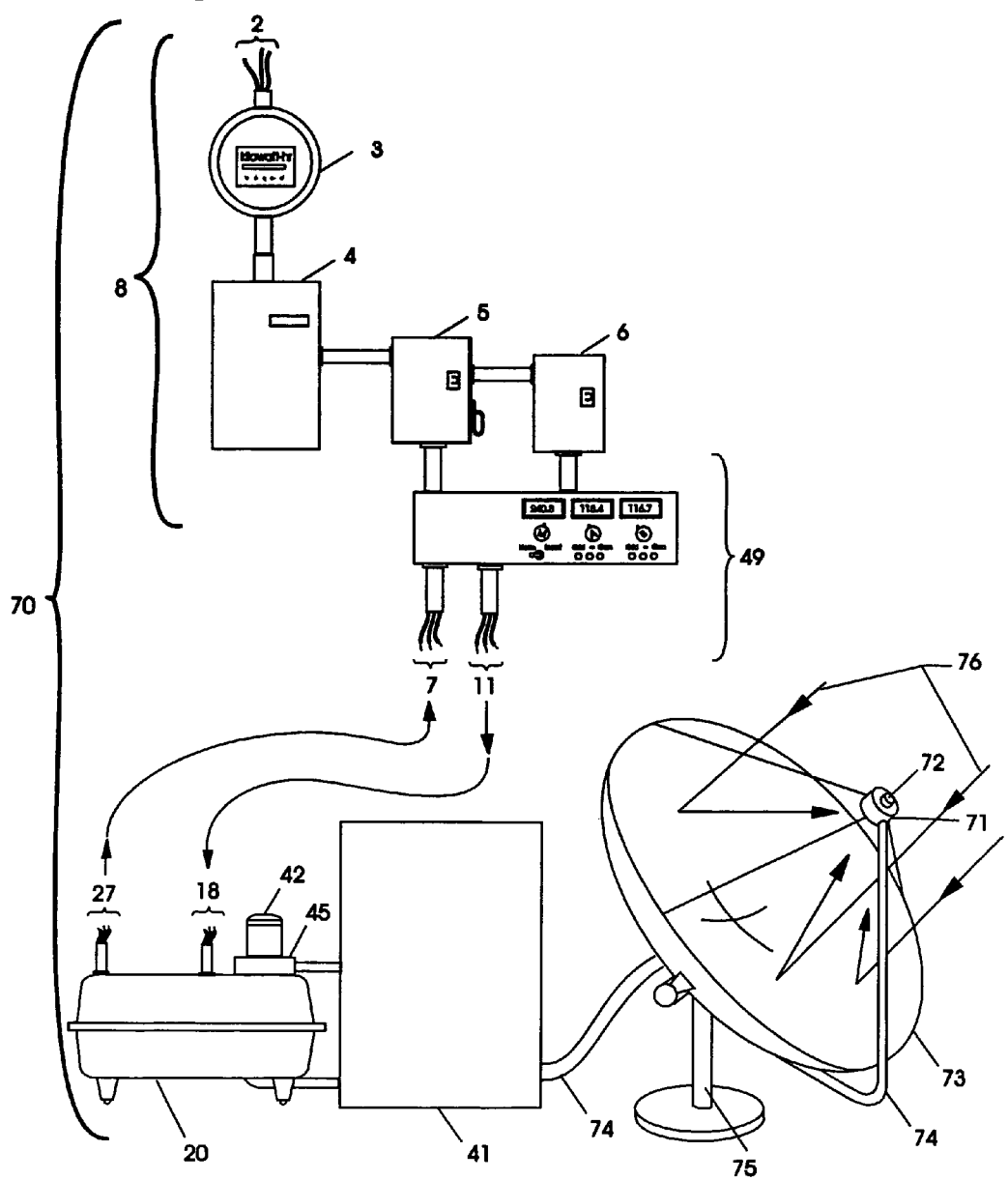
FIG. 9 illustrates a complete electrical system including a solar collector.

FIG. 9 shows how electrical system 8 connects to generator 20, operated with heat store 41 through controller 49 in system 70. The heat store in this example receives solar heating using concentrating reflector dish 73, focusing heat received from the sun onto target 71, with motorized blower 72 that moves superheated air and deposits the heat focused by dish 73 into heat store 41. Circulated air from heat store 41 is moved through target 71 for re-heating and is moved through heat store 41 through insulated coaxial conduit 74. Solar 2-axis tracking mount 75 moves with the sun each day to deposit heat into the store 41 that can be used by generator 20 to provide electrical power for the home day and nighttime and also to deposit energy into the grid as needed. Connections 7 of controller 49 connect to generator 20 with connections 27. Connections 11 of controller 49 connect to generator 20 with connections 18. This completes system 70 as a home electric generating system that operates like a much larger generator for the home by borrowing energy from the grid on need in overload conditions and delivers power to the grid on utility company demand by phone link to support the grid system overloads. System 70 can be disconnected from the grid by the utility when needed for safe grid repair by phone link, wireless link and over-the-grid electronic communications.

A manual method of presetting the controls of the grid-assisted, grid boosted home generator is described above. The home system 70 can also be controlled automatically with low cost microcontroller, using preset, learned, and operator suggested instructions instead of the manual inputs of manual controller 49.

Thus having described with text and figures several novel features of this invention including: a novel method of connecting a small generator to provide most of the electricity for home use, a way to safely borrow electricity from the grid beyond the capability of the generator, a way to insert electricity into the grid under control of the utility company, an automatic way to lock out all generators, preventing them from inserting energy into the grid during times of maintenance, a way to synchronize frequency and wave form in the generator for precise power insertion into the grid, a way to collect and store solar heat to make electricity for the home at all times and to power other components such as a water harvester and power a broad range of other useful products for home we claim:

We claim:

1. A device for connecting a direct current ("DC") producing thermoelectric generator that includes a DC bus through a facility electrical panel to an electric power company alternating current ("AC") grid wherein electrical grid power lines are connectable to special circuits of said device that are further connectable to said thermoelectric generator, said device comprising:

(A) a first special circuit of said device for producing DC having a voltage reduced from voltage of said electrical grid power lines, said first special circuit including:
(a) at least a pair of grid powered current limiting circuit breakers, an input terminal of each grid powered current limiting circuit breaker being connectable to one line of said electric power company AC grid; and
(b) at least a pair of rectifiers for receiving via said circuit breakers electrical energy that said first special circuit receives from said electric power company AC grid, a first of said rectifiers providing a negative DC voltage output and a second of said rectifiers providing a positive DC voltage output, each of said rectifier outputs being respectively connectable for supplying DC to the corresponding positive or negative voltage on the DC bus of said thermoelectric generator;

(B) a second special circuit of said device that integrates DC produced by said first special circuit with the output of said thermoelectric generator, said second special circuit providing a grid referenced AC voltage output to a main electrical service panel at a defined frequency, voltage and phase said second special circuit consisting of:
(a) a resistor ladder that receives AC electrical power from said grid connected to a sine wave generator the output of which is connected to a pulse width modulator,
(b) two outputs from said pulse width modulator connect each separately to opto-isolators, and an additional connection from said pulse width modulator is made to low voltage ground;
(c) the output from each said opto-isolator is connected separately to a MOSfet driver,
(d) the output from each said MOSfet driver is each separately connected to alternate inputs of an opto-isolated driven H-bridge; and (e) connection of the output from said H-bridge including a ground line is connected to the main electrical service panel;

(C) a third special circuit coupling positive and negative DC between said first circuit and said DC bus of said thermoelectric generator; and (D) at least two light dimmer circuits:
(a) an input of each light dimmer circuit connects respectively to an output terminal of said grid powered current limiting circuit breaker; and
(b) an output of said light dimmer circuit connects to an input of said rectifier, each light dimmer circuit including:
i. a triac having an input terminal that receives electrical power from said grid powered current limiting circuit breaker, and when in a electrically conducting state supplying electrical power to said rectifier from an output terminal of said triac;
ii. a neon bulb having a first terminal connected to a control terminal of said triac; and
iii. a variable resistor for supplying an electrical signal to a second terminal of said neon bulb for adjusting DC output from said first special circuit to a voltage less than the voltage of said electrical grid power lines.

2. A device according to claim 1 further comprising a multiple-pole double-throw switch installed between said electrical grid lines and said first special circuit allowing the facility to connect only to the grid.

3. A device according to claim 2 wherein said double-throw switch is electrically controlled.

4. A device according to claim 1 wherein the output of said positive voltage producing rectifier and the output of said negative voltage producing rectifier are each separately connect to ground by a capacitor.

5. A device according to claim 1 wherein said facility is a home.

6. A device according to claim 1 wherein said facility is an apartment complex.

7. A device according to claim 1 wherein said facility is a business.

8. A device according to claim 1 wherein said facility is a solar power station utilizing three phase voltages.

9. A device according to claim 1 wherein said facility is a wind power station.

10. A device according to claim 1 further comprising a frequency selection switch connected to said pulse width modulator.

11. A device according to claim 1 wherein said thermoelectric generator is powered from a heat storage reservoir.

12. A device according to claim 1 further comprising an adjustable control grid input and output to and from said thermoelectric generator.

\* \* \* \* \*